(12) United States Patent
Blanchard et al.

(10) Patent No.: US 10,600,898 B2
(45) Date of Patent: Mar. 24, 2020

(54) VERTICAL BIDIRECTIONAL INSULATED GATE TURN-OFF DEVICE

(71) Applicant: Pakal Technologies, Inc., San Francisco, CA (US)

(72) Inventors: Richard A. Blanchard, Los Altos, CA (US); Vladimir Rodov, Seattle, WA (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 16/278,566

(22) Filed: Feb. 18, 2019

(65) Prior Publication Data

US 2019/0259864 A1 Aug. 22, 2019

Related U.S. Application Data

(60) Provisional application No. 62/632,244, filed on Feb. 19, 2018.

(51) Int. Cl.
*H01L 29/745* (2006.01)
*H01L 29/747* (2006.01)

(52) U.S. Cl.
CPC ........ *H01L 29/7455* (2013.01); *H01L 29/747* (2013.01)

(58) Field of Classification Search
CPC .............. H01L 29/7455; H01L 29/747; H01L 29/0834; H01L 29/36; H01L 29/4236; H01L 29/0696
See application file for complete search history.

(56) References Cited

U.S. PATENT DOCUMENTS

2016/0181409 A1* 6/2016 Alexander ............. H01L 29/73
257/125

* cited by examiner

*Primary Examiner* — Kyoung Lee
(74) *Attorney, Agent, or Firm* — Patent Law Group; Brian D. Ogonowsky

(57) ABSTRACT

A vertical bidirectional insulated gate turn-off (IGTO) device includes a top half formed over a top surface of a substrate and a bottom half formed over the bottom surface of the substrate. A top electrode is formed over the top half, and a bottom electrode is formed over the bottom half. The layered structure forms vertical NPN and PNP transistors. Each half includes trenched gates. When a first polarity voltage is applied across the electrodes, one of the halves may be turned on by biasing its gates to conduct current between the top and bottom electrodes. When a voltage of an opposite polarity is applied across the electrodes, the other one of the halves may be turned on by biasing its gates to conduct current between the two electrodes. In one embodiment, biasing the gates increases the beta of the NPN transistor to turn on the device.

19 Claims, 7 Drawing Sheets

VERTICAL BIDIRECTIONAL INSULATED GATE TURN-OFF DEVICE

CROSS-REFERENCE TO RELATED APPLICATIONS

This application is based on provisional application Ser. No. 62/632,244, filed Feb. 19, 2018, by Richard Blanchard, assigned to the present assignee and incorporated herein by reference.

FIELD OF THE INVENTION

This invention relates to insulated gate turn-off (IGTO) devices and, more particularly, to an integrated, vertical bidirectional IGTO device.

BACKGROUND

FIG. 1 is a cross-section of a portion of an edge of an IGTO device 32 described in Applicant's U.S. Pat. No. 8,569,117, incorporated herein by reference. The p+ guard rings 57 and 58, formed in the n− epitaxial (epi) layer 50 near the edge of the die, reduce electric field crowding near the edges of the die to improve the breakdown voltage of the IGTO device. The trenched gates may form an interconnected mesh and are electrically connected to a top metal gate electrode 44 for biasing all the gates simultaneously. The gates may be repeated as a two-dimensional array of gates across the IGTO device, such as forming squares or hexagons, or, alternatively, the gates may be formed in parallel lines and interconnected at both ends by perpendicular trenches acting as busses. The gate material in the bus trenches is electrically conductive and is connected to the metal gate electrode 44, such as along the perimeter of the die. The various other components in the IGTO device 32 are connected in parallel so each repeated "cell" conducts a small portion of the total current.

The device 32 includes an n-epi layer 50, a p-well 36, insulated gate material 38, an oxide layer 39 within the trenches, an n+ layer 40 between the vertical gates, a cathode electrode 42, an anode electrode 54 contacting the p+ substrate 52, a gate electrode 44, and dielectric regions 46 patterned to insulate the metal from certain areas. The gate material 38 for all cells (forming interconnected vertical gate regions) is electrically connected to the metal gate electrode 44 via the gate material 56. The p-well 36 surrounds the gate structure, and the n− epi layer 50 extends to the surface around the p-well 36.

Such IGTO devices have a relatively high current density when on. In contrast, insulated gate bipolar transistors (IGBTs) generally have a lower current density when on. Accordingly, for at least high current applications, such IGTO devices are preferred.

The basic operation of the IGTO device is as follows.

An NPNP semiconductor layered structure is formed. In FIG. 1, there is a PNP transistor formed by the p+ substrate 52, the n− epi layer 50, and the p-well 36. There is also an NPN transistor formed by the n-epi layer 50, the p-well 36, and the top n+ layer 40. The top of the p-well 36 is shorted to the n+ layer 40 by the cathode electrode 42, outside of the cross-section, by periodically opening up portions of the n+ layer 40 to allow the cathode electrode 42 to directly contact the surface of the exposed p-well 36.

When a "forward bias" voltage polarity is applied between the bottom anode electrode 54 and the cathode electrode 42, but without a sufficiently positive gate bias, there is no current flow, since the product of the betas (gains) of the vertical PNP and NPN transistors is less than one.

When there is a sufficient positive voltage applied to the gate, and there is a sufficient anode-cathode voltage, electrons from the n+ layer 40 become the majority carriers along the sidewalls and below the bottom of the trenches in an inversion layer, causing the effective width of the NPN base (the portion of the p-well 36 below the trenches) to be reduced. As a result, the beta of the NPN transistor increases to cause the product of the betas to exceed one. This behavior results in "breakover," when holes are injected into the lightly doped n− epi layer 50 and electrons are injected into the p-well 36 to fully turn on the IGTO device. This condition is the controlled latch-up of the device. Accordingly, the gate bias initiates the turn-on, and the full turn-on is accomplished by the current flow through the NPN and PNP transistors.

When the gate bias is removed, the IGTO device turns off due to the product of the betas being less than one.

The IGTO device of FIG. 1 can only conduct in one direction. If the anode and cathode voltages are reversed, inner diodes of the device are reverse biased. If the potential difference is high, this places a great strain on the device, possibly resulting in damaging breakdown. It is difficult to form a robust device that can withstand such a high reverse voltage.

In some situations, it is desirable to use a bidirectional switch that can rapidly switch currents flowing in opposite directions. This may be done by connecting the IGTO device of FIG. 1 in parallel with an "upside down" IGTO device, and then controlling the two gates accordingly, depending on the polarity of the anode-cathode voltage. However, as mentioned above, the reverse biasing of one of the IGTO devices greatly stresses that device. Further, connecting two separate IGTO devices in parallel (including a series diode for each) adds real estate and cost to the circuit.

What is needed is a design for a robust bidirectional IGTO device that does not have the drawbacks of the devices mentioned above.

SUMMARY

An integrated, vertical bidirectional IGTO device die is disclosed. The die has a "top" half that may be similar to the device of FIG. 1, where the top half is formed over the top side of a p+ substrate. A mirror image of the top half is formed over the bottom side of the p+ substrate. The top electrode and the bottom electrode may then alternately act as the anode and cathode, depending on the polarity of the applied voltage. The gates of the two halves may be independently controlled.

The n+ layer and its associated p-well for each half are electrically connected to their overlying electrode (top or bottom electrode), so current may be conducted to that overlying electrode via either the n+ layer or the p-well, depending on the voltage polarity of the electrode.

If the top electrode has applied to it a negative voltage and the bottom electrode has applied to it a positive voltage (relative to the negative voltage), the top n+ layer conducts the current to the top electrode if the top half is turned on, and the bottom p-well conducts the current to the bottom electrode. The bottom half conducts via its forward biased diodes when it is turned off.

If the top electrode has applied to it a positive voltage and the bottom electrode has applied to it a negative voltage (relative to the negative voltage), the top p-well conducts the current to the top electrode, and the bottom n+ layer conducts the current to the bottom electrode if the bottom half is turned on. The top half conducts via its forward biased diodes when it is turned off.

In another embodiment, the p+ substrate is replaced with a lightly doped n substrate that acts as a base for the vertical PNP transistor and an emitter of the vertical NPN transistor.

In other embodiments, the top half is not a mirror image of the bottom half. In such cases, the n+ layer has gaps between the trenched gates where the p-well is directly contacted by its associated electrode, where electrons are not injected in those gap regions and where the gap regions oppose regions on the other side of the die that do inject electrons. In another embodiment, the gap regions that do not inject electrons do not contain trenched gates.

Other embodiments are described.

The performance of the bidirectional IGTO differs from that of a bidirectional latching device known as a triac. In the bidirectional IGTO, the current through the device goes to zero any time that the gate-to-cathode voltage on the side of the device acting as the "cathode" is reduced to a value below the threshold voltage of the device. In a triac, conduction will continue when the control voltage is taken to zero volts unless it occurs when the anode-to-cathode voltage is zero. In a triac, the area of one active portion of the device (e.g., the emitter on the upper side of the chip) must be placed at some lateral distance from the second active area (e.g., the emitter on the bottom side of the chip). This offset is required because, if this lateral distance is small, the electron/hole plasma can spread laterally in the active area, triggering the part of the device that should not be conducting. In the bidirectional IGTO, conduction occurs when the induced emitters are activated. In this condition, the other side of the device is not activated, and latching cannot occur. This behavior means that the regions on each surface do not need to be offset laterally, thereby reducing the area needed for the IGTO device.

BRIEF DESCRIPTION OF THE DRAWINGS

Elements that are similar or identical in the various figures are labeled with the same numeral.

DETAILED DESCRIPTION

Figure 1:
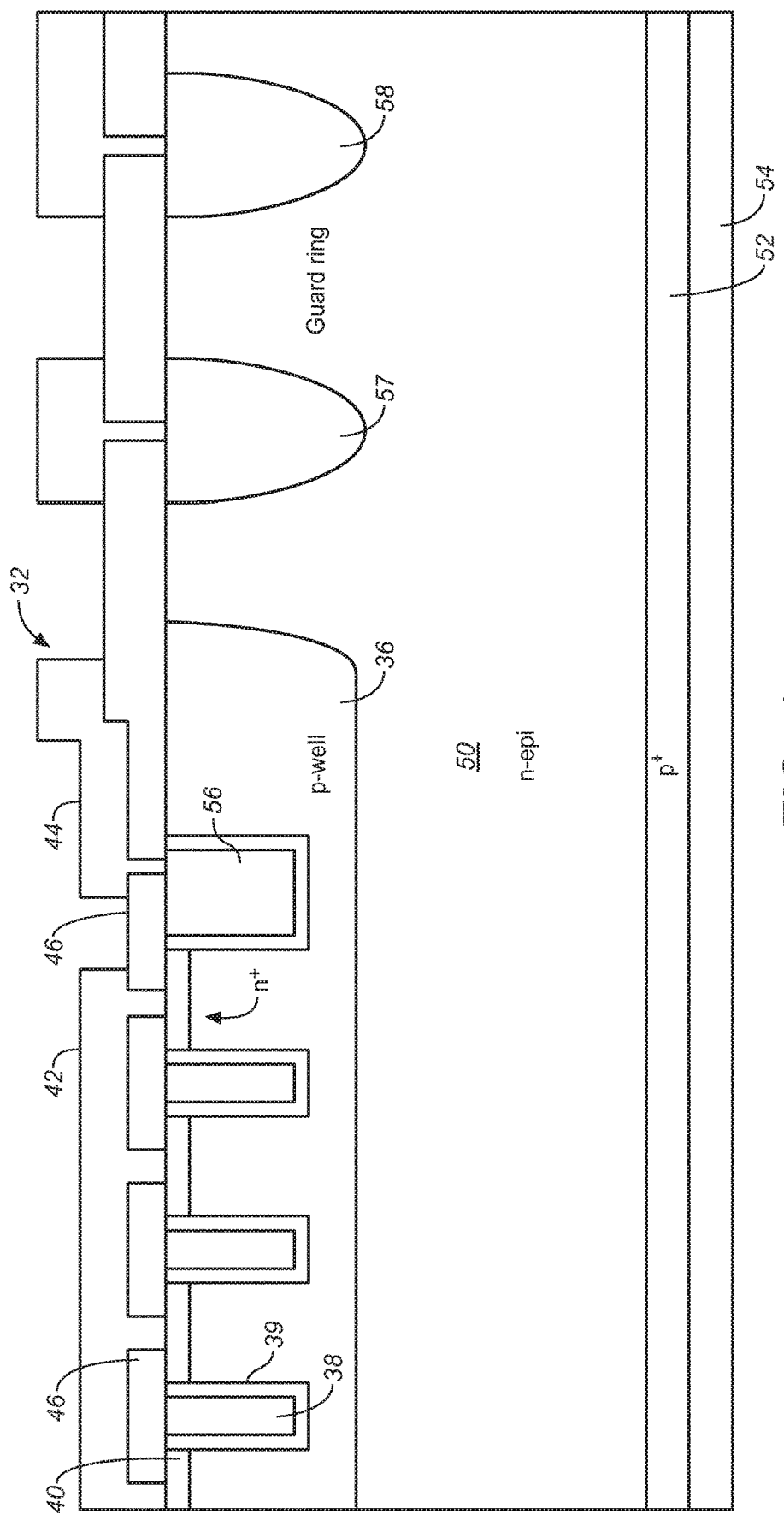
FIG. 1 is a cross-sectional view of an edge of a prior art IGTO device that only conducts in a single direction.
Figure 2:
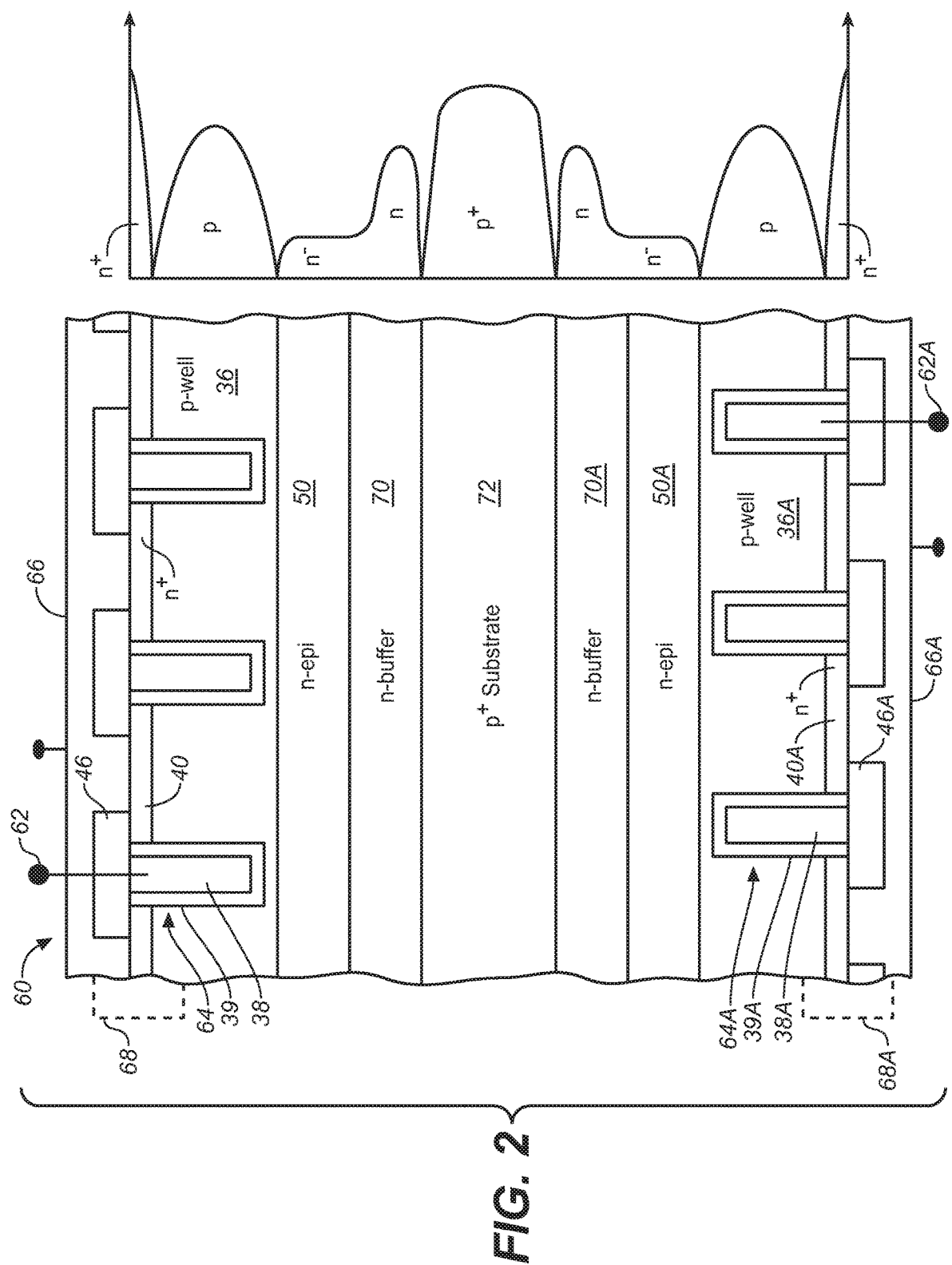
FIG. 2 is a cross-sectional view of a portion of an integrated, vertical bidirectional IGTO device, in accordance with one embodiment of the invention, where a top half and a bottom half are mirror images with a center p+ substrate.

FIG. 2 illustrates a portion of an integrated, vertical bidirectional IGTO device 60 in accordance with one embodiment of the invention. Elements labelled the same in FIGS. 1 and 2 may be similar or equivalent.

Gate electrodes 62 and 62A for the upper and lower halves of the IGTO device 60 may be the same as the gate electrode 44 in FIG. 1, where somewhere on the die, such as near the edges, a metal gate electrode contacts a trench filled with the conductive gate material (e.g., doped polysilicon), and that conductive gate material is part of an interconnected mesh of vertical gates.

In one embodiment, the gate trenches 64 (filled with conductive material 38) are formed as parallel trenches that are electrically connected together at both ends by a perpendicular trench acting as a bus for applying the gate voltage to all the gates. A metal gate electrode (such as electrode 44 in FIG. 1) is electrically connected to the bus trench along an edge of the die.

In another embodiment, the gate trenches form closed squares or hexagons in an interconnected mesh.

A thin gate oxide layer 39 insulates the gate material 38 from the p-well 36.

An n+ layer 40 overlies the p-well 36 and extends between the trenches 64.

A metal top electrode 66 can be a cathode or anode electrode, depending on the polarity of the voltage. The electrode 66 contacts the n+ layer between the dielectric regions 46. At certain locations, outside of the cross-section, there is an opening in the n+ layer 40 where the top electrode 66 contacts the p-well 36. This electrical connection is represented by the schematic connection 68. A p+ contact region may be formed in the p-well 36 for ohmic contact with the top electrode 66.

The p-well 36 is formed in/over an n-epi layer 50. The p-well 36 may be formed by diffusion into the n-epi layer 50 or doped in-situ while being grown. (If doped in-situ, a termination trench may be used.) In either case, the p-well 36 is referred to herein as a "layer" over the n-epi layer 50 since it extends across the die except for the termination region around the perimeter of the die.

The n-epi layer 50 is formed over an optional, more highly doped n-buffer layer 70. The n-buffer layer 70 and the upper semiconductor layers are epitaxially grown over the p+ substrate 72.

The relative dopant concentrations in the various semiconductor layers are shown on the right side of FIG. 2.

A substantially mirror image structure is formed on the opposite surface of the p+ substrate 72. The bottom half components are labeled with the same element numbers as the top half but with the suffix "A". Some misalignment in the opposing structures is acceptable and is shown in FIG. 2.

The bottom half may be formed by flipping the wafer after every process step, or may be formed after the top half is formed.

One method for forming the top half is described below, and the bottom half is formed to have identical characteristics.

The starting p+ substrate 72 may have a dopant concentration of $1 \times 10^{18}$ to $2 \times 10^{19}$ cm$^{-3}$. The thickness may range between 100-725 microns depending on the maximum operating voltage of the device, such as between 600-1200 volts.

To reduce the injection of holes into the n– epi layer 50 from the p+ substrate 72 when the device is off, the n-type buffer layer 70 is grown with a dopant concentration higher than that of the n– epi layer 50. The n-type buffer layer 70 may be grown to a thickness of 3-10 microns thick and has a dopant concentration between about $10^{16}$ to $5\times10^{18}$ $cm^{-3}$.

The n– epi layer 50 is grown to a thickness of 40-70 microns (for a 600V device) and has a doping concentration between about $5\times10^{13}$ to $5\times10^{14}$ $cm^{-3}$. This dopant concentration can be obtained by in-situ doping during epi growth.

The p-well 36 is then formed by masking and boron dopant implantation. The peak doping in the p-well 36 can be, for example, $10^{16}$-$10^{18}$ $cm^{-3}$. The depth of the p-well 36 depends on the maximum voltage of the device and may be between 1.0-12 microns, but deeper than the trench.

In one embodiment, the n+ layer 40 is formed by an implant of arsenic or phosphorus at an energy of 10-150 keV and an area dose of $5\times10^{13}$ to $10^{16}$ $cm^{-2}$, to create a dopant concentration exceeding $10^{19}$ $cm^{-3}$. In one embodiment, the n+ layer 40 has a depth of 0.05-2.0 microns. A deeper, lower doped, n-type layer may additionally be formed adjacent to the n+ layer 40/40A to improve the breakdown voltage.

Either before or after the implant which forms the shallow n+ layer 40, trenches 64 are etched in the active areas using RIE. In one embodiment, the trenches 64 can be, for example, 1-10 microns deep. The minimum lateral trench widths are constrained by lithographic and etching limitations. Trench widths 1 micron or less are preferred.

After the trenches 64 are etched, a gate oxide layer 39 is grown on the sidewalls and bottoms of the trenches 64 to, for example, 0.05-0.15 microns thick. Conductive material 38, such as heavily doped polysilicon or undoped polysilicon that is subsequently doped, fills the trenches 64 and is planarized to form the gate regions in all the cells.

A contact mask opens the dielectric (e.g., oxide) layer 46 above the selected regions on the top surface to be contacted by metal electrodes.

Various metal layers are then deposited to form the gate electrodes 62/62A and the top and bottom electrodes 66/66A.

In one embodiment, the epi layers are deposited on both surfaces of the substrate 72 before subsequent processing occurs. This process flow requires starting wafers polished on both surfaces.

The operation of the bidirectional IGTO device 60 is the same as described with respect to FIG. 1, except that the top half and bottom half may be independently controlled to conduct current in either direction depending on the voltage polarities applied to the top and bottom electrodes 66 and 66A. Turn-on of either half may be accomplished with a gate voltage of 2-8 volts.

In one embodiment, the bidirectional IGTO device 60 switches an AC current, where the gate control coincides with the particular polarity of the voltage. The IGTO device 60 is particularly useful as a high power AC motor control.

Figure 3:
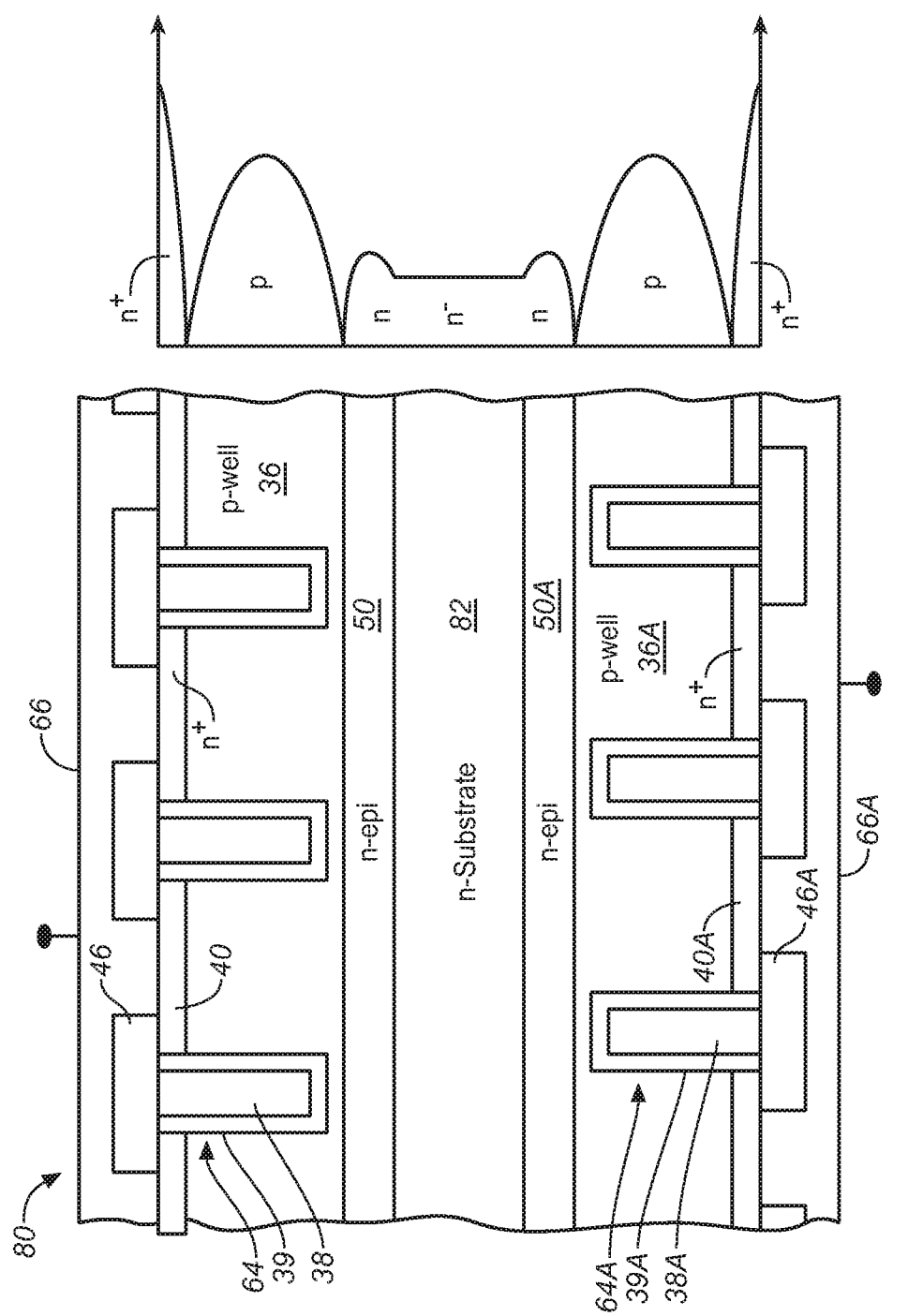
FIG. 3 is a cross-sectional view of a portion of an integrated, vertical bidirectional IGTO device, in accordance with another embodiment of the invention, where a top half and a bottom half are mirror images with a center n– substrate.

FIG. 3 illustrates an IGTO device 80 that is identical to the device of FIG. 2 except that all layers are formed over both surfaces of an n-substrate 82 rather than over a p+ substrate. The relative doping profiles are shown on the right side of FIG. 3. A deeper n-type region may also be included adjacent to the n+ layers 40/40A.

In all embodiments, the trenches of both halves are preferably aligned for maximum efficiency. However, some misalignment due to mask tolerances is acceptable, and shown in FIGS. 2 and 3, since carriers spread as they flow away from the locations where the electrodes 66/66A contact the n+ layer 40/40A.

In another embodiment, two wafers are bonded together to form the top and bottom halves of the bidirectional IGTO device. The bond may be by a conductive adhesive or electrostatic bonding may be used. The bonded wafers are then singulated.

In the embodiments shown, the trenches only extend into the p-well 36 and not into the n-epi layer 50.

Figure 4:
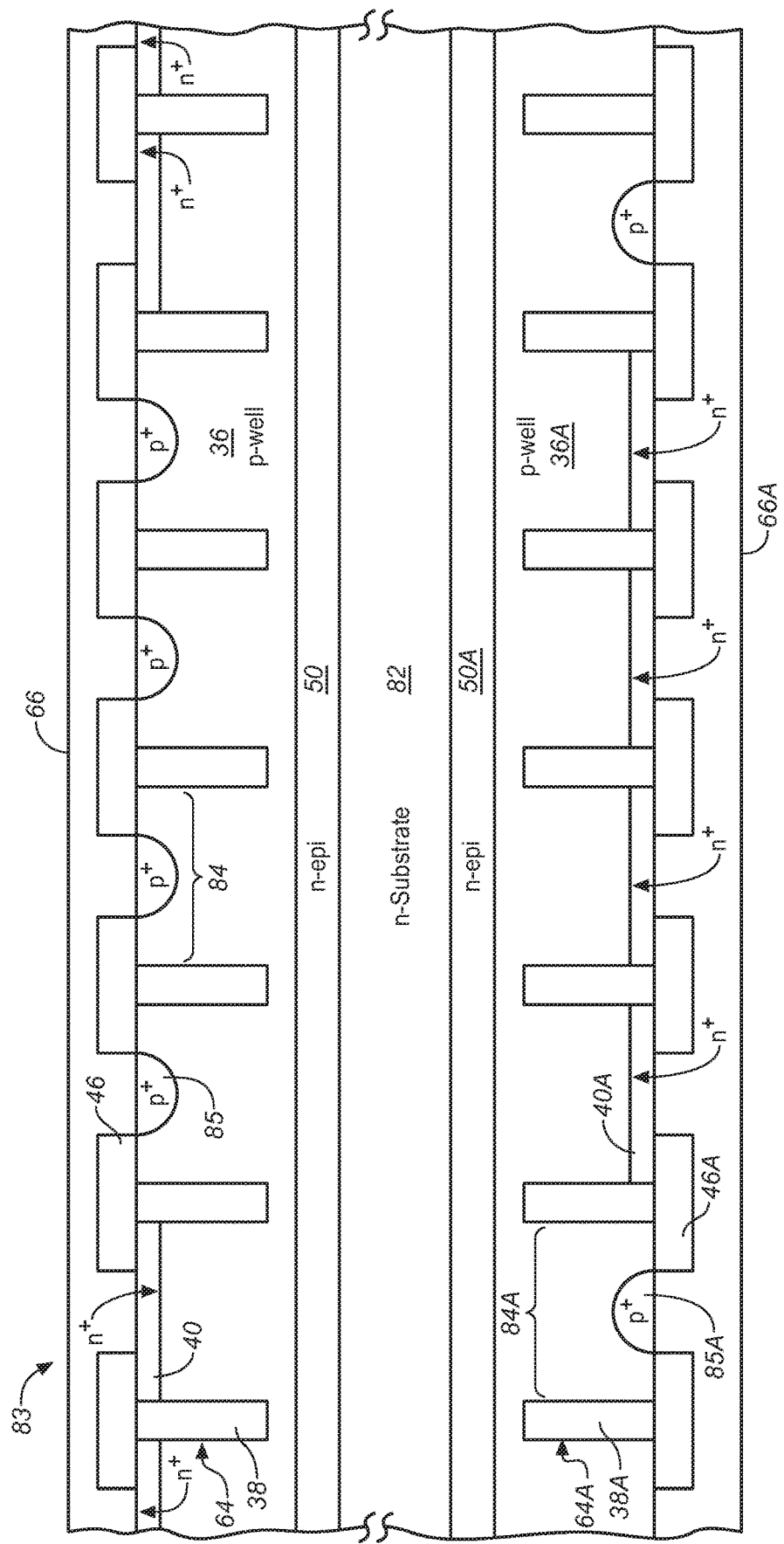
FIG. 4 is a cross-sectional view of a portion of an integrated, vertical bidirectional IGTO device, in accordance with another embodiment of the invention, where there are gaps in the n+ layer between certain trenched gates so electrons are not injected in those regions, and where the regions that do not inject electron face regions that do inject electrons.

FIG. 4 shows a device 83 similar to FIG. 3 except that the n+ layers 40 and 40A are omitted between some trenches to form gaps 84 and 84A where the p-well 36/36A contacts the associated electrode 66/66A. P+ regions 85/85A in the p-well 36/36A surface provide lower contact resistance to the p-well 36/36A. The areas with the n+ layer 40/40A between the trenches 64/64A inject electrons (depending on the polarity of the voltage applied to the electrodes 66 and 66A). The gaps 84/84A do not inject electrons. The gaps 84/84A that do not inject electrons on one surface face the n+ layers 40/40A that do inject electrons on the opposite surface. The number of gaps 84/84A (non-injecting areas) approximately equals the number of n+ layer 40/40A regions (injecting areas) for symmetrical performance of the device. This structure improves efficiency by creating shorter vertical paths for current flow, and the gaps 84/84A form more efficient collectors for the vertical PNP transistor.

Assuming a positive voltage is applied to the top electrode 66, a negative voltage is applied to the bottom electrode 66A, and the device is turned on, electrons will be injected from the bottom n+ layer 40A between the trenches 64A, and the electrons will create a vertical current through the upper p-well 36 to be conducted by the upper electrode 66 where it contacts the p-well 36. The opposite current flows when the polarities are reversed and the other gates are properly biased.

Figure 5:
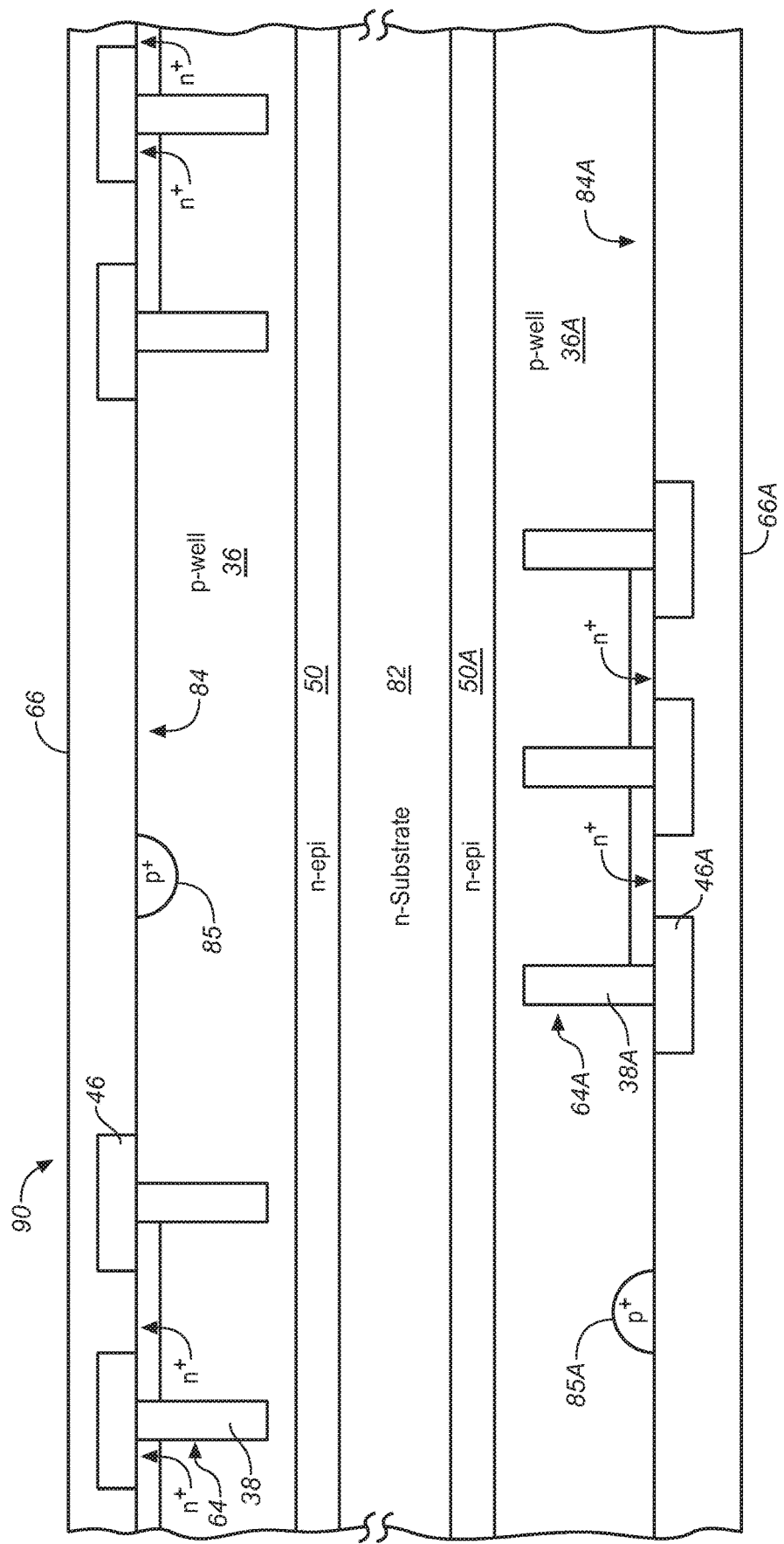
FIG. 5 is a cross-sectional view of a portion of an integrated, vertical bidirectional IGTO device, in accordance with another embodiment of the invention, where regions that do not inject electrons do not contain trenched gates or n+ regions.

FIG. 5 illustrates a device 90 similar to FIG. 4 except that the regions that do not inject electrons do not contain any trenches or n+ layer regions. This variation increases the effective collector area for the PNP transistor (where the p-well 36/36A contacts the electrode 66/66A) to further improve efficiency.

Figure 6:
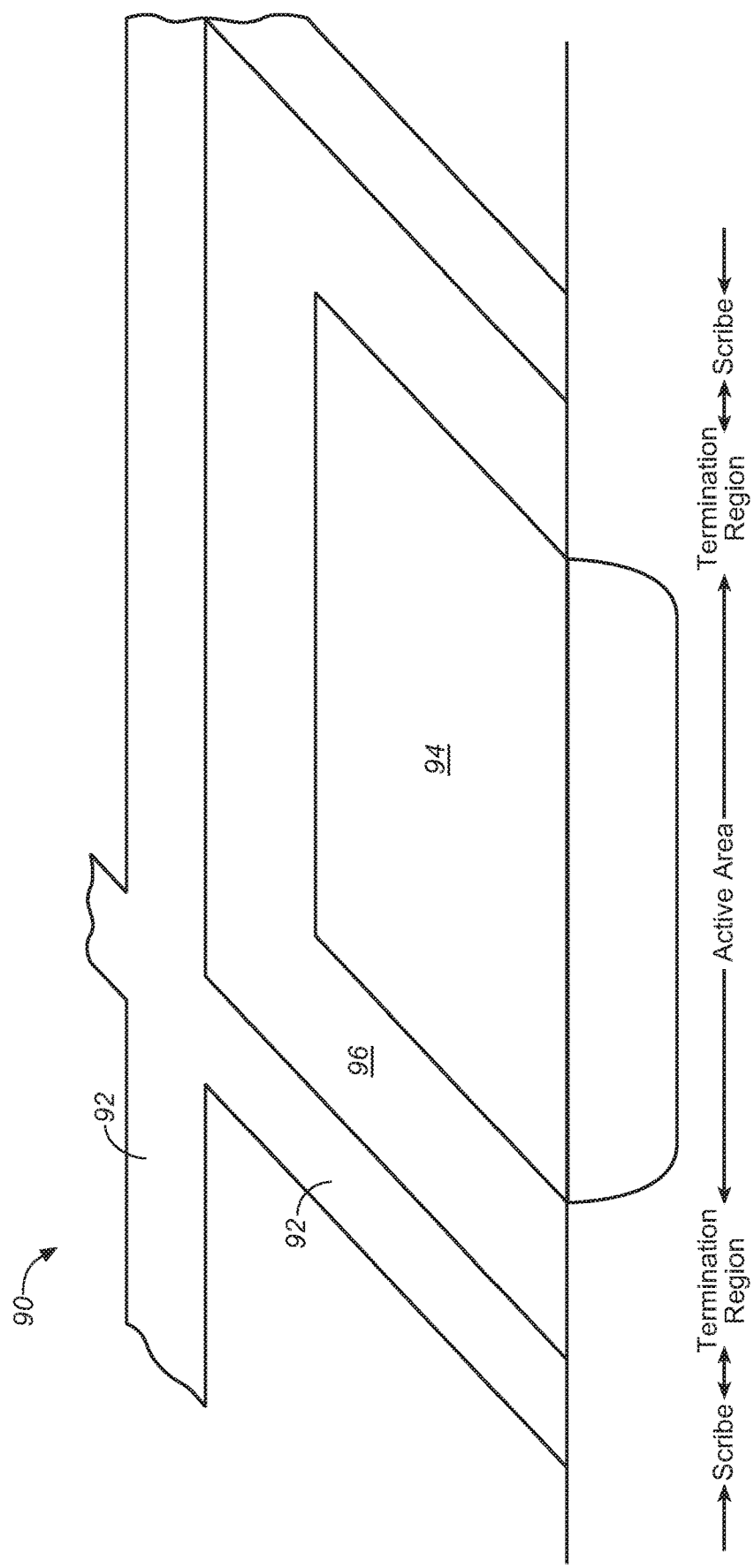
FIG. 6 is a perspective view of a top semiconductor surface of a non-singulated wafer during processing of the bidirectional IGTO device, showing the active area (inner cells) and a termination area for individual IGTO devices formed in the wafer.

FIG. 6 is a perspective view of the semiconductor surface of a non-singulated wafer 90 showing scribe lines 92 around each IGTO device die. The dies include a central active area 94 and a peripheral termination region 96. The termination region 96 includes guard rings, such as shown in FIG. 1.

Figure 7:
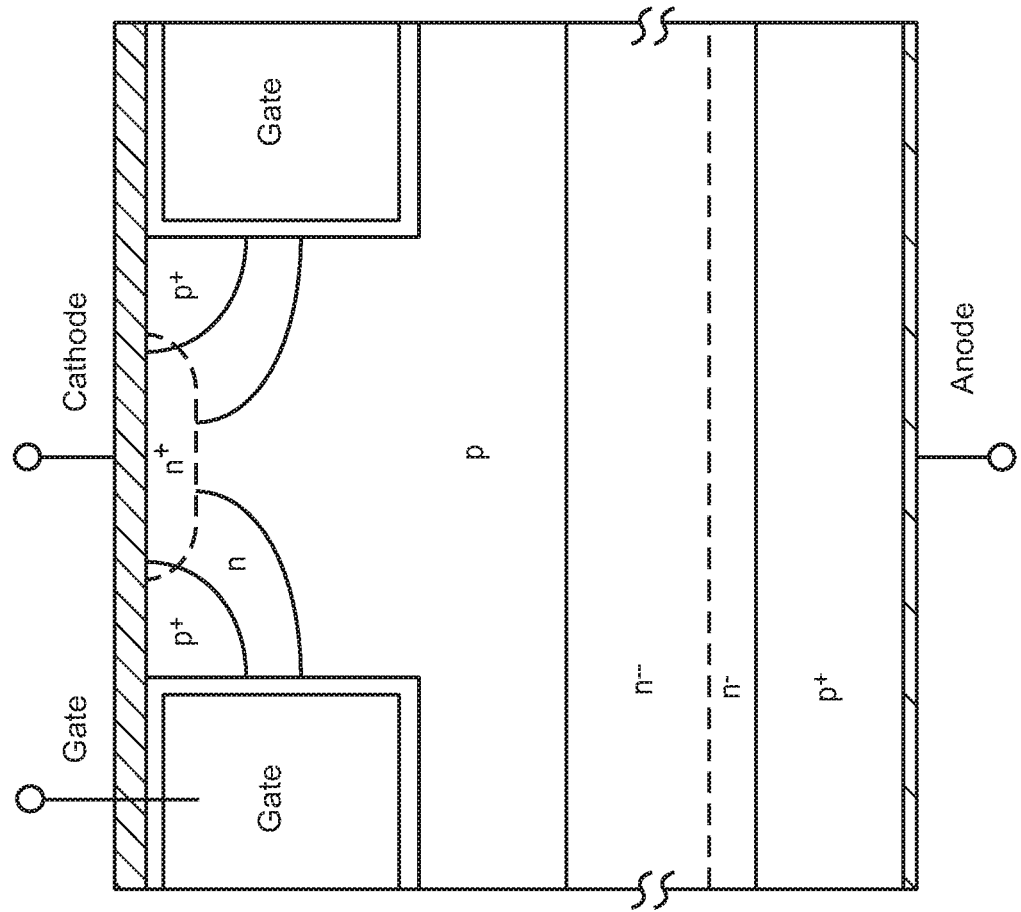
FIG. 7 illustrates a prior art structure from the inventors' U.S. Pat. Re47,072.

FIG. 7 illustrates a prior art IGTO device from the inventors' U.S. Pat. Re47,072, incorporated herein by reference. Such a structure may be made bi-directional by fabricating the IGTO device on both sides of the substrate. Any of the techniques described herein may be used to modify the bi-directional structure to improve its performance, such as the techniques described with respect to FIGS. 4 and 5. The IGTO device of FIG. 7 allows the device to be turned off after latch-up with a much less negative gate voltage, compared to the prior art described in U.S. Pat. Re47,072. The cells are formed to have upper p+ regions on both sides of the n+ source region that extend vertically below the n+ source region, and an n layer is formed between the p-well and the upper p+ regions. The n+ source regions and the upper p+ regions are shorted by the cathode electrode. The p+ regions, the n layer, and the p-well form a vertical p-channel MOSFET, where the n-layer adjacent the vertical gate forms the body. The p-channel MOSFET turns on with a slightly negative gate voltage (a threshold voltage) relative to the cathode electrode (the p+ region acts as a source for the p-channel MOSFET). Turning on the p-channel MOSFET shorts (to an extent) the base-emitter of the wide-base vertical NPN transistor to turn it off and to thereby turn off the IGTO device, even when there is latch-up. In the event there is no latch-up, the p-channel MOSFET is not required to help turn off the device, so simply shorting the gate to the cathode electrode will shut off the device.

The IGTO devices in any of the figures may have the polarities of the materials reversed.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A bidirectional insulated gate turn-off device formed as a die comprising:
    a substrate having a first surface and an opposing second surface;
    a first gate-controlled portion formed over the first surface of the substrate, the first gate-controlled portion comprising:
        a first semiconductor layer of a first conductivity type formed over the first surface;
        a second semiconductor layer of a second conductivity type formed over the first semiconductor layer;
        a third semiconductor layer of the first conductivity type formed over the second semiconductor layer;
        a first plurality of insulated gate regions within trenches formed at least within the second semiconductor layer, wherein the first plurality of insulated gate regions within the trenches terminates within the second semiconductor layer; and
        a first electrode electrically contacting the second semiconductor layer and the third semiconductor layer;
    a second gate-controlled portion formed over the second surface of the substrate, the second gate-controlled portion comprising:
        a fourth semiconductor layer of the first conductivity type formed over the second surface;
        a fifth semiconductor layer of the second conductivity type formed over the fourth semiconductor layer;
        a sixth semiconductor layer of the first conductivity type formed over the fifth semiconductor layer;
        a second plurality of insulated gate regions within trenches formed at least within the fifth semiconductor layer, wherein the second plurality of insulated gate regions within the trenches terminates within the fifth semiconductor layer; and
        a second electrode electrically contacting the fifth semiconductor layer and the sixth semiconductor layer,
        wherein conduction between the first electrode and the second electrode, while a voltage of a first polarity is coupled across the first electrode and the second electrode, is achieved by applying a gate voltage to the first plurality of insulated gate regions; and
        wherein conduction between the first electrode and the second electrode, while a voltage of a second polarity, opposite to the first polarity, is coupled across the first electrode and the second electrode, is achieved by applying the gate voltage to the second plurality of insulated gate regions.

2. The device of claim 1 wherein the substrate is of the second conductivity type.

3. The device of claim 1 wherein the substrate is of the first conductivity type.

4. The device of claim 1 wherein a vertical structure of NPN and PNP transistors is formed within the device.

5. The device of claim 4 wherein a first voltage applied to the first plurality of insulated gate regions increases a beta of a first one of the NPN and PNP transistors to conduct current in a first direction between the first electrode and the second electrode.

6. The device of claim 5 wherein a second voltage applied to the second plurality of insulated gate regions increases a beta of a second one of the NPN and PNP transistors to conduct current in a second direction between the first electrode and the second electrode.

7. The device of claim 1 wherein the first conductivity type is an n-type and the second conductivity type is a p-type.

8. The device of claim 1 wherein the second semiconductor layer is a well, and the fifth semiconductor layer is a well.

9. The device of claim 1 wherein the third semiconductor layer is more highly doped than the first semiconductor layer, and the sixth semiconductor layer is more highly doped than the fourth semiconductor layer.

10. The device of claim 1 wherein the second gate-controlled portion is a mirror image of the first gate-controlled portion.

11. The device of claim 1 wherein the third semiconductor layer is between some of the insulated gate regions in the first plurality of insulated gate regions but not between all of the insulated gate regions in the first plurality of insulated gate regions, and
    wherein the sixth semiconductor layer is between some of the insulated gate regions in the second plurality of insulated gate regions but not between all of the insulated gate regions in the second plurality of insulated gate regions.

12. The device of claim 11 wherein areas where the third semiconductor layer is between the insulated gate regions in the first plurality of insulated gate regions oppose areas where the sixth semiconductor layer is not between the insulated gate regions in the second plurality of insulated gate regions, and
    wherein areas where the sixth semiconductor layer is between the insulated gate regions in the second plurality of insulated gate regions oppose areas where the third semiconductor layer is not between the insulated gate regions in the first plurality of insulated gate regions.

13. The device of claim 12 wherein there are no insulated gate regions in the first plurality of insulated gate regions that oppose the areas where the sixth semiconductor layer is between the insulated gate regions in the second plurality of insulated gate regions, and
    wherein there are no insulated gate regions in the second plurality of insulated gate regions that oppose the areas where the third semiconductor layer is between the insulated gate regions in the first plurality of insulated gate regions.

14. The device of claim 1 wherein the first electrode acts as an anode electrode and the second electrode acts as a cathode electrode when a voltage applied across the first electrode and the second electrode is of a first polarity, and
    wherein the first electrode acts as a cathode electrode and the second electrode acts as an anode electrode when the voltage applied across the first electrode and the second electrode is of a second polarity.

15. The device of claim 1 wherein the first plurality of insulated gate regions are aligned with the second plurality of insulated gate regions.

16. The device of claim 1 wherein the first plurality of insulated gate regions are not aligned with the second plurality of insulated gate regions.

17. The device of claim 1 wherein the first electrode electrically contacts the second semiconductor layer via a highly doped region of the second conductivity type formed in the second semiconductor layer, and
   wherein the second electrode electrically contacts the fifth semiconductor layer via a highly doped region of the second conductivity type formed in the fifth semiconductor layer.

18. The device of claim 1 wherein the second semiconductor layer is a first well region formed by diffusing dopants of the second conductivity type into the first semiconductor layer, and
   wherein the fifth semiconductor layer is a second well region formed by diffusing dopants of the second conductivity type into the fourth semiconductor layer.

19. The device of claim 1 further comprising:
   a first vertical p-channel MOSFET formed in the first gate-controlled portion; and
   a second vertical p-channel MOSFET formed in the second gate-controlled portion,
   wherein the first vertical p-channel MOSFET and the second vertical p-channel MOSFET aid in device turn-off when the first plurality of insulated gate regions or the second plurality of insulated gate regions is taken sufficiently negative.

* * * * *